US012768758B2

(12) United States Patent
Negishi et al.

(10) Patent No.: US 12,768,758 B2
(45) Date of Patent: Oct. 20, 2026

(54) SPECIMEN HOLDER, SPECIMEN HOLDER SET, AND SPECIMEN PREPARATION METHOD

(71) Applicant: JEOL Ltd., Tokyo (JP)

(72) Inventors: Tsutomu Negishi, Tokyo (JP); Shinobu Mori, Tokyo (JP)

(73) Assignee: JEOL Ltd., Tokyo (JP)

(*) Notice: Subject to any disclaimer, the term of this patent is extended or adjusted under 35 U.S.C. 154(b) by 366 days.

(21) Appl. No.: 18/416,425

(22) Filed: Jan. 18, 2024

(65) Prior Publication Data

US 2024/0248014 A1 Jul. 25, 2024

(30) Foreign Application Priority Data

Jan. 19, 2023 (JP) ................................ 2023-006643

(51) Int. Cl.

| | |
|---|---|
| ***G01N 1/36*** | (2006.01) |
| ***B24B 37/27*** | (2012.01) |
| ***B24B 41/06*** | (2012.01) |
| ***G01N 1/28*** | (2006.01) |
| ***G01N 1/32*** | (2006.01) |
| ***H01J 37/20*** | (2006.01) |

(Continued)

(52) U.S. Cl.

CPC ............... *G01N 1/36* (2013.01); *G01N 1/286* (2013.01); *G01N 1/32* (2013.01); *B24B 37/27* (2013.01); *B24B 41/06* (2013.01); *G01N 2001/2866* (2013.01); *H01J 37/20* (2013.01); *H01J 37/30* (2013.01); *H01J 37/3053* (2013.01); *H01J 37/3056* (2013.01); *H01J 2237/2007* (2013.01); *H01J 2237/20207* (2013.01); *H01J 2237/3151* (2013.01); *H01J 2237/31745* (2013.01)

(58) Field of Classification Search

CPC .. G01N 1/36; G01N 1/286; G01N 2001/2866; G01N 1/32; H01J 37/20; H01J 2237/31745; H01J 2237/3151; H01J 2237/20207; H01J 2237/2007; H01J 37/3056; H01J 37/3053; H01J 37/30; B24B 37/27; B24B 41/06

USPC ...................................................... 73/864.91

See application file for complete search history.

(56) References Cited

U.S. PATENT DOCUMENTS

2002/0061261 A1* 5/2002 Pfeifer .................. G02B 21/26
422/400
2016/0139398 A1* 5/2016 Negishi .................. H01J 37/20
359/393

(Continued)

FOREIGN PATENT DOCUMENTS

CN 115229317 A * 10/2022 ............ B23K 10/00
JP 4675860 B2 * 4/2011

(Continued)

OTHER PUBLICATIONS

Translation_CN_115229317 (Year: 2022).*

*Primary Examiner* — Peter J Macchiarolo
*Assistant Examiner* — Monica S Young
(74) *Attorney, Agent, or Firm* — The Webb Law Firm

(57) ABSTRACT

A specimen holder includes a holder main body, a specimen mount to which a specimen is to be fixed, and a pressing member which slidably presses the specimen mount against the holder main body. A through-hole is provided in the specimen mount, and the specimen mount is tilted with respect to the holder main body by tilting a rod-like member which is inserted into the through-hole.

13 Claims, 17 Drawing Sheets

(51) Int. Cl.
*H01J 37/30* (2006.01)
*H01J 37/305* (2006.01)

(56) References Cited

U.S. PATENT DOCUMENTS

| | | | | |
|---|---|---|---|---|
| 2018/0342369 | A1* | 11/2018 | Kataoka | C23C 14/5833 |
| 2018/0358201 | A1* | 12/2018 | Negishi | H01J 37/20 |
| 2019/0287755 | A1 | 9/2019 | Kataoka et al. | |

FOREIGN PATENT DOCUMENTS

| | | | | | |
|---|---|---|---|---|---|
| JP | 2019160575 | A | | 9/2019 | |
| KR | 20220093286 | A | * | 7/2022 | H01J 37/20 |
| WO | WO-2012070517 | A1 | * | 5/2012 | H01J 37/3053 |
| WO | WO-2017179145 | A1 | * | 10/2017 | G01N 1/28 |

* cited by examiner

SPECIMEN HOLDER, SPECIMEN HOLDER SET, AND SPECIMEN PREPARATION METHOD

CROSS-REFERENCE TO RELATED APPLICATION

This application claims priority to Japanese Patent Application No. 2023-006643, filed Jan. 19, 2023, the disclosure of which is hereby incorporated by reference in its entirety.

BACKGROUND OF THE INVENTION

Field of the Invention

The present invention relates to a specimen holder, a specimen holder set, and a specimen preparation method.

Description of Related Art

As ion beam milling apparatus for milling a specimen using an ion beam, for instance, Cross Section Polisher (registered trademark) for milling a cross section of the specimen, and Ion Slicer (registered trademark) for preparing a thin-film specimen are known.

For example, JP-A-2019-160575 discloses a specimen milling apparatus for milling a cross section of a specimen by covering a part of the specimen with a shield plate and cutting, with an ion beam, a portion of the specimen not covered by the shield plate.

Mechanical polishing may be performed as pretreatment of cross-sectional specimen preparation by an ion beam milling apparatus. In mechanical polishing performed as pretreatment of cross-sectional specimen preparation, for example, a specimen is polished by around several hundred μm in thickness.

When milling a specimen with an ion beam milling apparatus or polishing a specimen with a mechanical polishing apparatus, a tilt of the specimen is adjusted. For example, when polishing the specimen with a mechanical polishing apparatus, a tilt of a front surface of the specimen is adjusted so that a surface to be a polishing target of the specimen becomes parallel to a polished surface. In addition, for example, when milling the specimen with an ion beam milling apparatus, a tilt of the specimen with respect to a shield plate is adjusted. Therefore, a specimen holder which enables a tilt of a specimen to be adjusted is desired.

SUMMARY OF THE INVENTION

According to a first aspect of the present disclosure, there is provided a specimen holder including:

- a holder main body;
- a specimen mount to which a specimen is to be fixed; and
- a pressing member which slidably presses the specimen mount against the holder main body,
- a through-hole being provided in the specimen mount, and
- the specimen mount being tilted with respect to the holder main body by tilting a rod-like member which is inserted into the through-hole.

According to a second aspect of the present disclosure, there is provided a specimen holder set including:

- the above specimen holder, and
- the above rod-like member.

According to a third aspect of the present disclosure, there is provided a specimen preparation method including:

- fixing a specimen to a specimen mount;
- slidably pressing the specimen mount to which the specimen has been fixed, against a holder main body by a pressing member; and
- inserting a rod-like member into a through-hole provided in the specimen mount and adjusting a tilt of the specimen mount by tilting the rod-like member.

DESCRIPTION OF THE INVENTION

According to an embodiment of the present disclosure, there is provided a specimen holder including:

a holder main body;

a specimen mount to which a specimen is to be fixed; and a pressing member which slidably presses the specimen mount against the holder main body, a through-hole being provided in the specimen mount, and the specimen mount being tilted with respect to the holder main body by tilting a rod-like member which is inserted into the through-hole.

In such a specimen holder, a tilt of a specimen mount can be adjusted by tilting a rod-like member inserted into a through-hole of the specimen mount. Therefore, such a specimen holder enables a tilt of a specimen to be adjusted.

According to an embodiment of the present disclosure, there is provided a specimen holder set including:

the above specimen holder; and the rod-like member.

According to an embodiment of the present disclosure, there is provided a specimen preparation method including:

fixing a specimen to a specimen mount;

slidably pressing the specimen mount to which the specimen has been fixed, against a holder main body by a pressing member; and inserting a rod-like member into a through-hole provided in the specimen mount and adjusting a tilt of the specimen mount by tilting the rod-like member.

With such a specimen preparation method, a tilt of a specimen mount can be adjusted by tilting a rod-like member inserted into a through-hole of the specimen mount. Therefore, such a specimen preparation method enables a tilt of a specimen to be adjusted.

Now preferred embodiments of the invention will be described in detail below with reference to the drawings. The embodiments described below are not intended to unduly limit the scope of the invention as stated in the claims. Further, all of the components described below are not necessarily essential requirements of the invention.

1. First Embodiment

1.1. Specimen Holder

Figure 1:
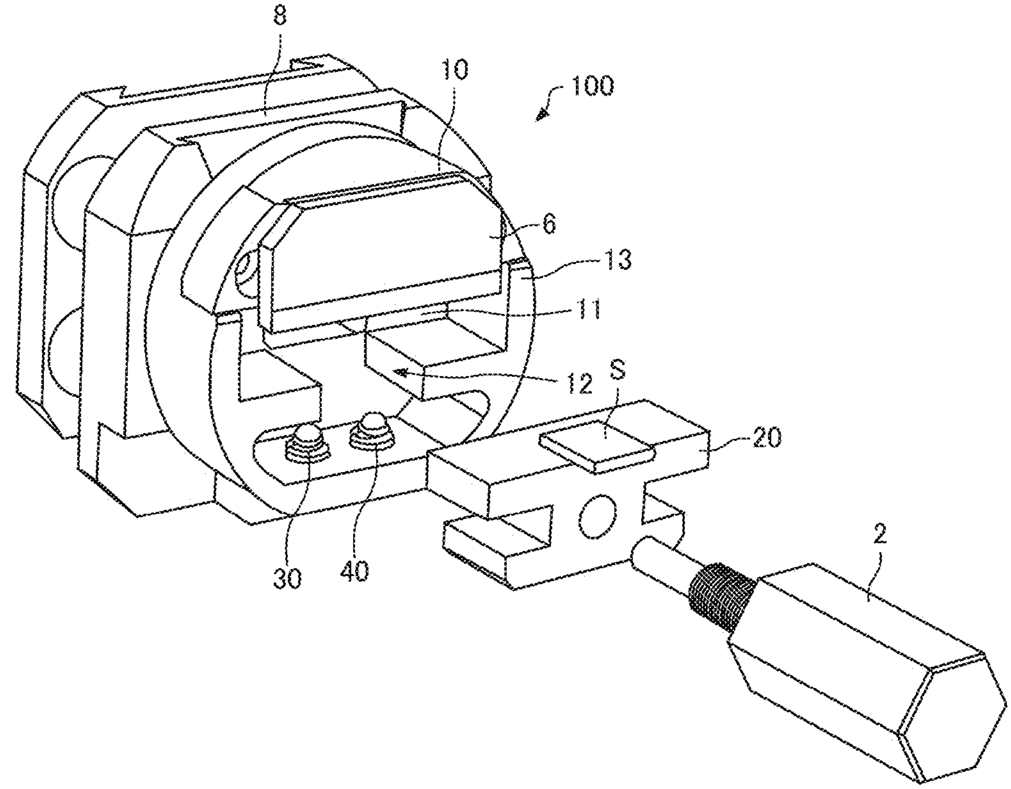
FIG. 1 is a perspective view schematically illustrating a specimen holder according to the first embodiment.

First, a specimen holder according to a first embodiment will be described with reference to the drawings. FIG. 1 is a perspective view schematically illustrating a specimen holder 100 according to the first embodiment. FIG. 1 illustrates a state where a holder main body 10 is attached to an adapter 8 for an ion beam milling apparatus.

The specimen holder 100 is a specimen holder that can be shared by a mechanical polishing apparatus and the ion beam milling apparatus. As illustrated in FIG. 1, the specimen holder 100 includes the holder main body 10, a specimen mount 20, a first plunger 30, and a second plunger 40.

Figure 2:
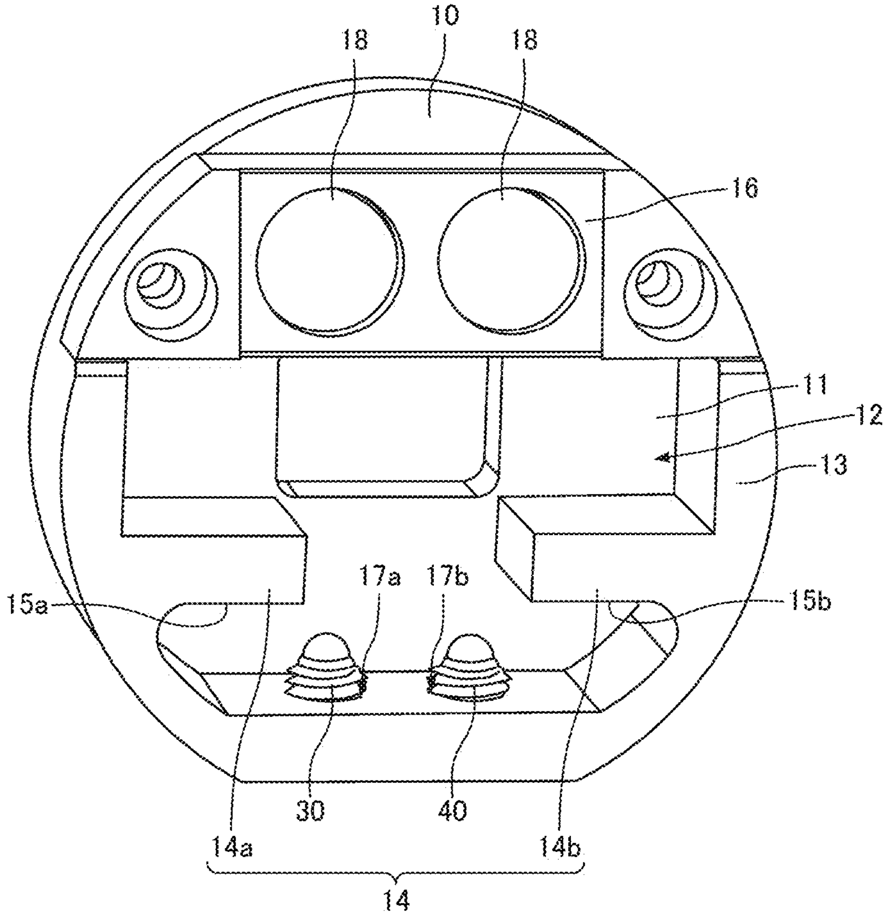
FIG. 2 is a diagram schematically illustrating a holder main body.

FIG. 2 is a diagram schematically illustrating the holder main body 10 of the specimen holder 100. The holder main body 10 holds the specimen mount 20. The holder main body 10 includes a bottom 11 and a wall 13 that encloses the bottom 11. The specimen mount 20 is arranged in a recessed portion 12 formed by the bottom 11 and the wall 13.

The holder main body 10 is provided with a guide 14. The guide 14 restricts a movement range of the specimen mount 20. The guide 14 includes a first guide rail 14*a* and a second guide rail 14*b*. The first guide rail 14*a* and the second guide rail 14*b* are protruding parts that protrude from the wall 13.

The holder main body 10 includes a mounting part 16 to which a shield plate 6 for the ion beam milling apparatus and a polishing target jig for the mechanical polishing apparatus are to be interchangeably mounted. In the example illustrated in FIG. 1, the shield plate 6 is mounted to the mounting part 16. A magnet 18 is embedded in the mounting part 16 and the shield plate 6 and the polishing target jig are to be fixed by the magnet 18. Therefore, the shield plate 6 and the polishing target jig can be interchangeably mounted to the mounting part 16. Note that means used by the mounting part 16 to interchangeably mount the shield plate 6 and the polishing target jig is not limited to the magnet 18 and other means such as a screw or a clip may be used.

Figure 3:
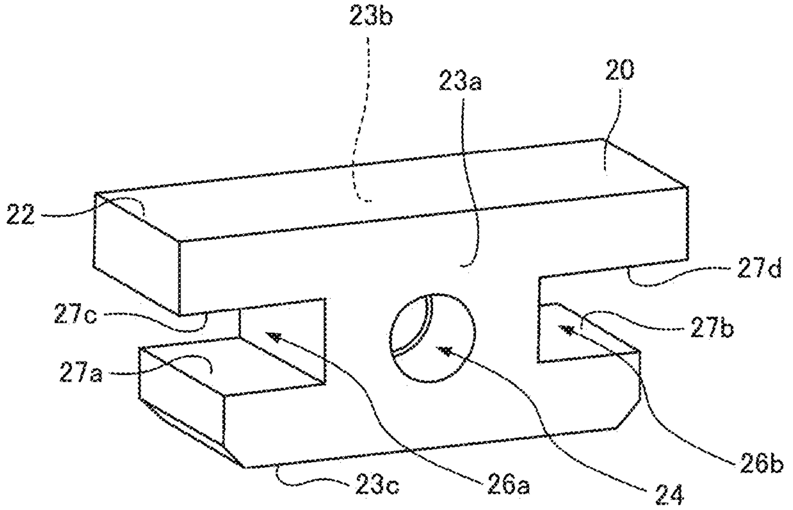
FIG. 3 is a diagram schematically illustrating a specimen mount.

FIG. 3 is a diagram schematically illustrating the specimen mount 20. A specimen S is to be fixed to the specimen mount 20. For example, the specimen S is fixed to a specimen placement surface 22 of the specimen mount 20 by a fixing wax. Note that a method of fixing the specimen S to the specimen mount 20 is not particularly limited.

The specimen mount 20 is provided with a through-hole 24 which penetrates the specimen mount 20. The through-hole 24 penetrates the specimen mount 20 between a first surface 23*a* and a second surface 23*b*. The first surface 23*a* and the second surface 23*b* are surfaces which are connected to the specimen placement surface 22 and which are orthogonal to the specimen placement surface 22. The first surface 23*a* and the second surface 23*b* are surfaces which face mutually opposite directions or, in other words, surfaces in a two-sided relationship. An adjustment jig 2 for adjusting a position of the specimen mount 20 is inserted into the through-hole 24. The adjustment jig 2 is a rod-like member with a male screw formed on an outer circumferential surface thereof. A female screw which screws with the male screw of the adjustment jig 2 is formed in the through-hole 24.

The specimen mount 20 is provided with a first groove 26*a* which engages with the first guide rail 14*a* and a second groove 26*b* which engages with the second guide rail 14*b* provided on the holder main body 10. The first guide rail 14*a* passes between an inner surface 27*a* and an inner surface 27*c* which oppose each other of the first groove 26*a*. The second guide rail 14*b* passes between an inner surface 27*b* and an inner surface 27*d* which oppose each other of the second groove 26*b*. Therefore, a movement range of the specimen mount 20 is restricted. For example, a shape of the specimen mount 20 is an H-shape as illustrated in FIG. 3.

The first plunger 30 and the second plunger 40 press the specimen mount 20 against the holder main body 10 so as to be slidable. The first plunger 30 and the second plunger 40 press a third surface 23*c* of the specimen mount 20. Due to the first plunger 30 and the second plunger 40 pressing the third surface 23*c*, the inner surface 27*a* of the first groove 26*a* of the specimen mount 20 is pressed against a side surface 15*a* of the first guide rail 14*a* of the holder main body 10 and the inner surface 27*b* of the second groove 26*b* of the specimen mount 20 is pressed against a side surface 15*b* of the second guide rail 14*b* of the holder main body 10.

Figure 4:
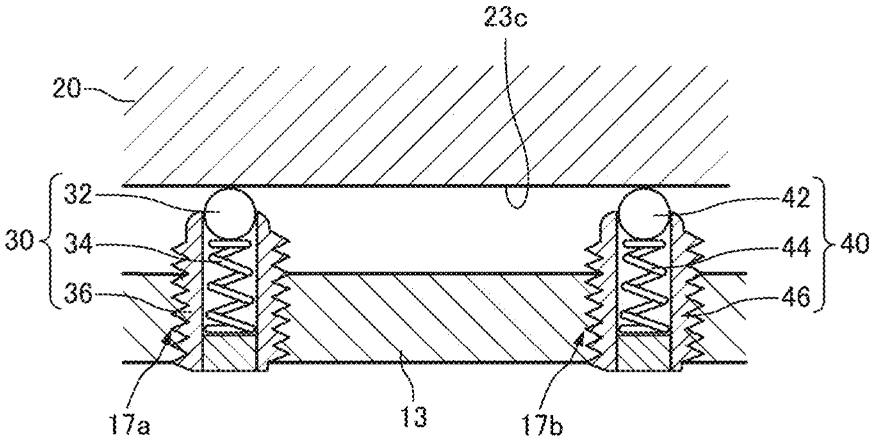
FIG. 4 is a sectional view schematically illustrating a first plunger and a second plunger.

FIG. 4 is a sectional view schematically illustrating the first plunger 30 and the second plunger 40.

The first plunger 30 includes a first contact member 32, a first spring 34, and a first shaft 36. The first contact member 32 comes into contact with the third surface 23*c* of the specimen mount 20. The first contact member 32 is, for example, a metal ball or a resin ball. The first spring 34 imparts a pressing force to the first contact member 32. The first spring 34 is, for example, a compression coil spring. The first shaft 36 internally houses the first spring 34. A male screw is formed on an outer circumferential surface of the first shaft 36.

The first plunger 30 is inserted into a first hole 17*a* provided in the wall 13 of the holder main body 10. A female screw is formed on an inner surface of the first hole 17_a_ and screws with a male screw formed on an outer circumferential surface of the first shaft 36. Therefore, by tightening the first plunger 30 (in other words, by rotating clockwise), the first spring 34 is compressed and a force by which the first plunger 30 presses the specimen mount 20 increases. In addition, by loosening the first plunger 30 (in other words, by rotating counterclockwise), the first spring 34 is extended and the force by which the first plunger 30 presses the specimen mount 20 decreases.

The second plunger 40 includes a second contact member 42, a second spring 44, and a second shaft 46. The second contact member 42 comes into contact with the third surface 23_c_ of the specimen mount 20. The second contact member 42 is, for example, a metal ball or a resin ball. The second spring 44 imparts a pressing force to the second contact member 42. The second spring 44 is, for example, a compression coil spring. The second shaft 46 internally houses the second spring 44. A male screw is formed on an outer circumferential surface of the second shaft 46.

The second plunger 40 is inserted into a second hole 17_b_ provided in the wall 13 of the holder main body 10. A female screw is formed on an inner surface of the second hole 17_b_ and screws with a male screw formed on an outer circumferential surface of the second shaft 46. Therefore, by tightening the second plunger 40, the second spring 44 is compressed and a force by which the second plunger 40 presses the specimen mount 20 increases. In addition, by loosening the second plunger 40, the second spring 44 is extended and the force by which the second plunger 40 presses the specimen mount 20 decreases. As described above, using the first plunger 30 and the second plunger 40 enables forces by which the specimen mount 20 is pressed against the holder main body 10 to be made variable.

1.2. Specimen Preparation Method

Figure 5:
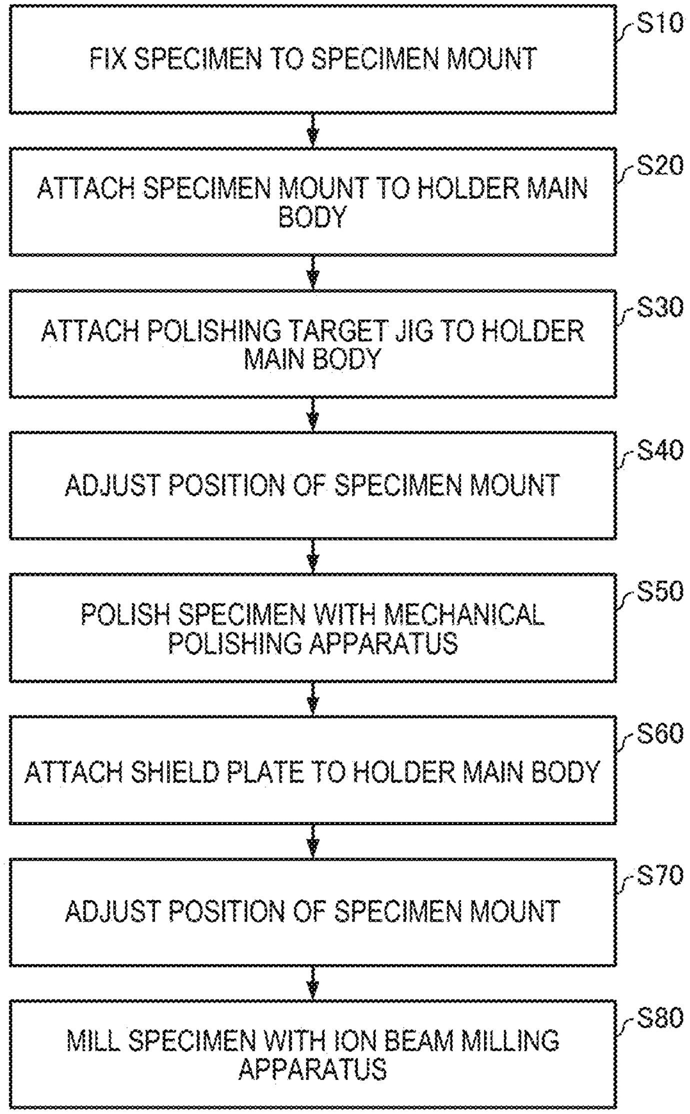
FIG. 5 is a flow chart illustrating an example of a specimen preparation method using the specimen holder according to the first embodiment.

Next, a specimen preparation method using the specimen holder 100 will be described. FIG. 5 is a flow chart illustrating an example of the specimen preparation method using the specimen holder 100. FIGS. 6 to 19 are diagrams for explaining specimen preparation steps using the specimen holder 100. A case of preparing a cross-sectional specimen for a scanning electron microscope will now be described.

(1) Fix Specimen to Specimen Mount (S10)

Figure 6:
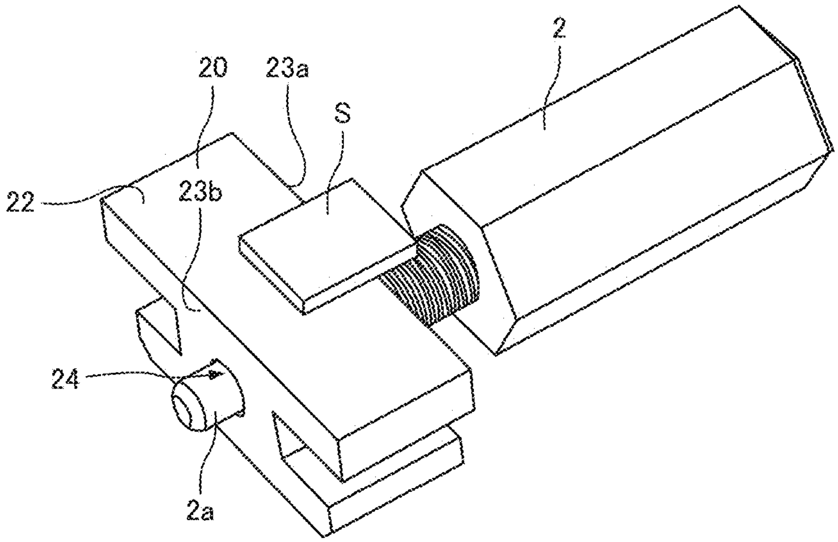
FIG. 6 is a diagram for explaining specimen preparation steps.

As illustrated in FIG. 6, the specimen S is fixed to the specimen placement surface 22 of the specimen mount 20. For example, the specimen S is fixed to the specimen mount 20 by a fixing wax. The specimen S is fixed so that an end of the specimen S protrudes from the specimen mount 20. A length of a protruding portion of the specimen S from the specimen mount 20 is, for example, around 2 mm.

Figure 7:
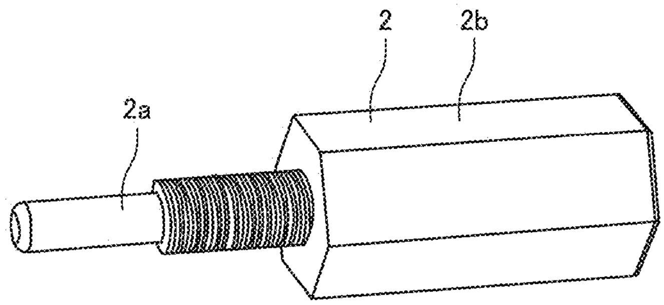
FIG. 7 is a diagram for explaining specimen preparation steps.

After the specimen S is fixed to the specimen mount 20, the adjustment jig 2 is inserted into the through-hole 24 of the specimen mount 20. FIG. 7 is a diagram schematically illustrating the adjustment jig 2. As illustrated in FIG. 7, the adjustment jig 2 includes a rod-like part 2_a_ and a gripping part 2_b_. A male screw is formed on a root of the rod-like part 2_a_ but a male screw is not formed in a tip section of the rod-like part 2_a_. By not forming a male screw in the tip section of the rod-like part 2_a_, the number of times the adjustment jig 2 is to be rotated when inserting the adjustment jig 2 into the through-hole 24 can be reduced.

As illustrated in FIG. 6, by inserting the adjustment jig 2 into the through-hole 24 from a side of the first surface 23_a_ of the specimen mount 20 and rotating the adjustment jig 2 clockwise, the adjustment jig 2 is fixed to the specimen mount 20. At this point, the adjustment jig 2 is inserted into the through-hole 24 until a tip of the rod-like part 2_a_ of the adjustment jig 2 protrudes from an opening of the second surface 23_b_ of the through-hole 24.

(2) Attach Specimen Mount to Holder Main Body (S20)

Figure 8:
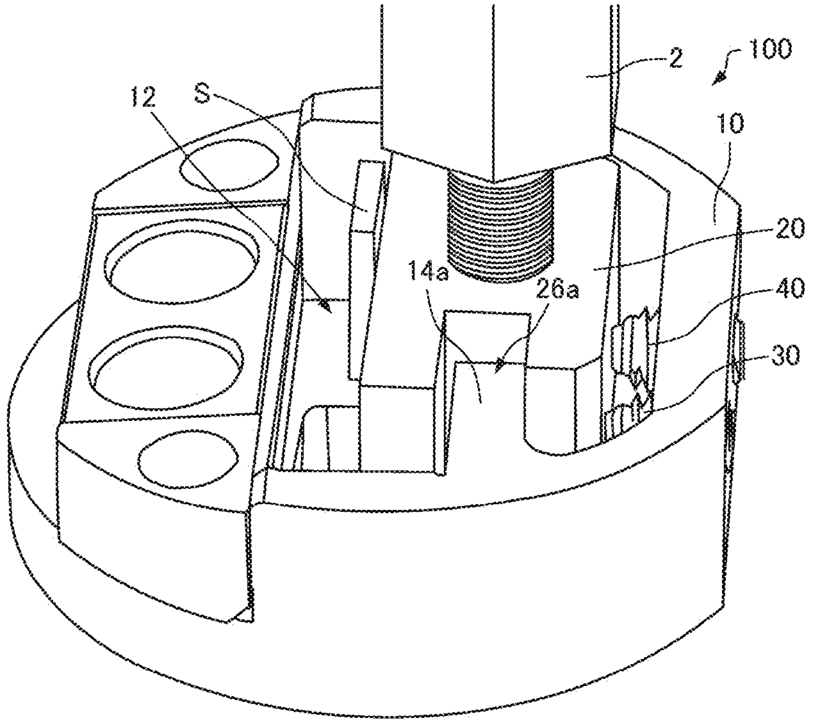
FIG. 8 is a diagram for explaining specimen preparation steps.

As illustrated in FIG. 8, the specimen mount 20 is attached to the holder main body 10. Specifically, first, the specimen mount 20 is arranged in the recessed portion 12 of the holder main body 10. At this point, since the specimen mount 20 can be held via the adjustment jig 2, the specimen mount 20 can be arranged in the recessed portion 12 without directly touching the specimen mount 20. In addition, when arranging the specimen mount 20 in the recessed portion 12, the first groove 26_a_ of the specimen mount 20 is caused to engage with the first guide rail 14_a_ and the second groove 26_b_ of the specimen mount 20 is caused to engage with the second guide rail 14_b_. Accordingly, the movement range of the specimen mount 20 can be restricted. In this manner, since the specimen mount 20 can be guided to the recessed portion 12 by the guide 14, damage to the specimen S due to the specimen S coming into contact with the holder main body 10 can be prevented.

Figure 9:
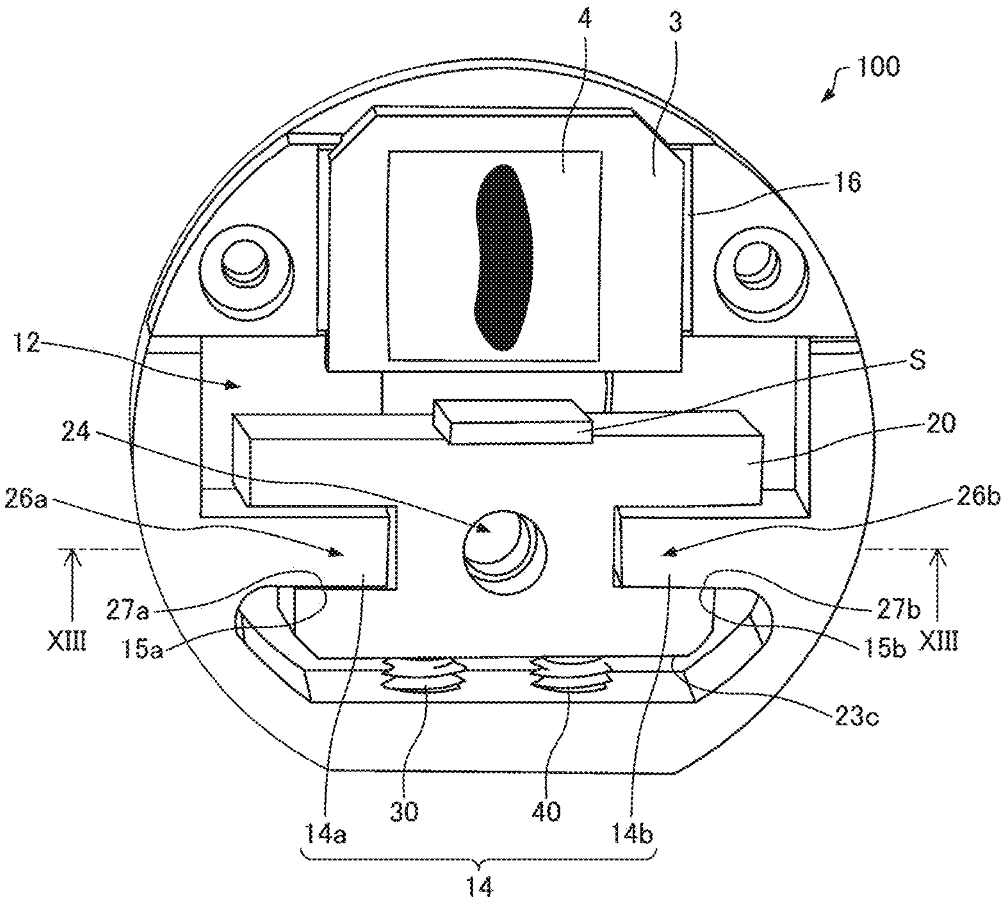
FIG. 9 is a diagram for explaining specimen preparation steps.

Next, as illustrated in FIG. 9, the specimen mount 20 to which the specimen S is fixed is pressed against the holder main body 10 by the first plunger 30 and the second plunger 40. Due to pressing the third surface 23_c_ of the specimen mount 20 by the first plunger 30 and the second plunger 40, the inner surface 27_a_ of the first groove 26_a_ of the specimen mount 20 is pressed against the side surface 15_a_ of the first guide rail 14_a_ of the holder main body 10 and the inner surface 27_b_ of the second groove 26_b_ of the specimen mount 20 is pressed against the side surface 15_b_ of the second guide rail 14_b_ of the holder main body 10. Note that illustration of the adjustment jig 2 inserted into the through-hole 24 has been omitted in FIG. 9 for the sake of convenience.

At this point, forces by which the first plunger 30 and the second plunger 40 press the specimen mount 20 are used by the specimen mount 20 as forces to slidably move the holder main body 10. Accordingly, the inner surface 27_a_ and the side surface 15_a_ can be made a sliding surface against which the specimen mount 20 slides and the inner surface 27_b_ and the side surface 15_b_ can be made a sliding surface against which the specimen mount 20 slides. Therefore, the specimen mount 20 becomes slidable with respect to the holder main body 10.

(3) Attach Polishing Target Jig to Holder Main Body (S30)

Figure 10:
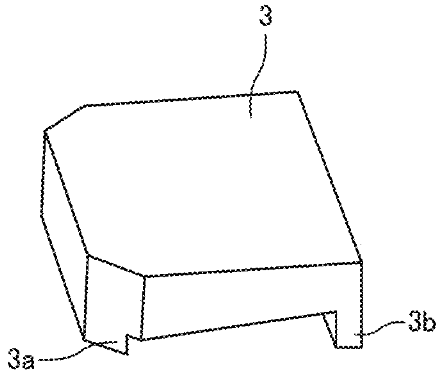
FIG. 10 is a diagram for explaining specimen preparation steps.

As illustrated in FIG. 9, a polishing target jig 3 is mounted to the mounting part 16 of the holder main body 10. FIG. 10 is a perspective view schematically illustrating the polishing target jig 3. For example, the polishing target jig 3 is a jig for holding a target to be a guide of an amount of polishing of the specimen S when polishing the specimen S with the mechanical polishing apparatus. For example, a waterproof tape 4 is applied to a front surface of the polishing target jig 3 and the waterproof tape 4 is marked with oil-based ink or the like. Polishing is ended when the mark disappears in the polishing step. Note that a mark is not limited to the mark drawn on the waterproof tape 4. The polishing target jig 3 is provided with a pawl part 3_a_ and a pawl part 3_b_.

Figure 11:
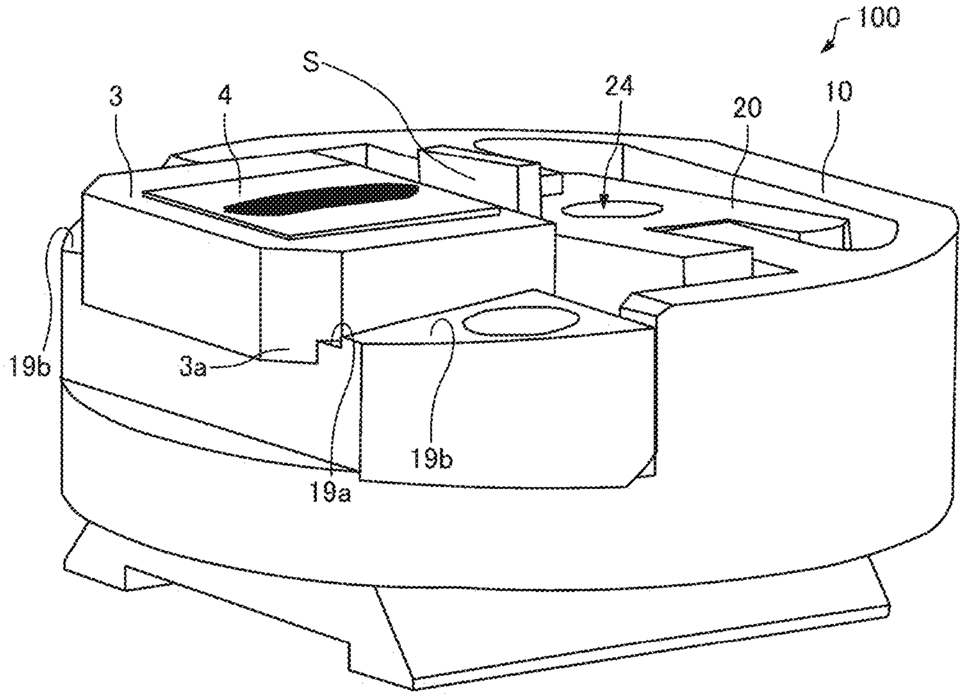
FIG. 11 is a diagram for explaining specimen preparation steps.

As illustrated in FIG. 11, the mounting part 16 includes a first placement surface 19_a_ and two second placement surfaces 19_b_. The first placement surface 19_a_ is positioned between the two second placement surfaces 19_b_. There is a level difference between the first placement surface 19_a_ and each second placement surface 19_b_, and the two second placement surfaces 19_b_ are positioned on a higher level than the first placement surface 19_a_. The polishing target jig 3 is placed on the first placement surface 19_a_. The polishing target jig 3 that is placed on the first placement surface 19*a* is fixed by the two level differences and the two pawl parts 3*a* and 3*b*. Note that an illustration of the adjustment jig 2 inserted into the through-hole 24 has been omitted in FIG. 11 for the sake of convenience.

(4) Adjust Position of Specimen Mount (S40)

Figure 12:
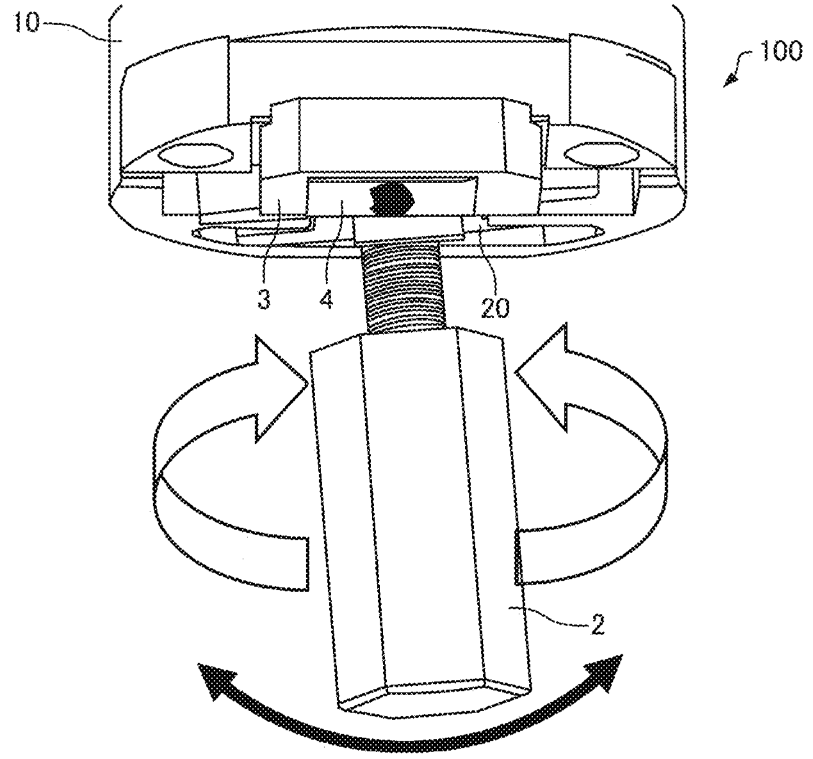
FIG. 12 is a diagram for explaining specimen preparation steps.

As illustrated in FIG. 12, the position of the specimen mount 20 is adjusted using the adjustment jig 2 inserted into the through-hole 24 of the specimen mount 20. Specifically, a tilt of the specimen mount 20 is adjusted by tilting the adjustment jig 2. Accordingly, a tilt of the specimen S can be adjusted. For example, the tilt of the specimen S is adjusted so that a polishing position of the specimen S becomes parallel to the holder main body 10. In addition, by rotating the adjustment jig 2, the female screw formed in the through-hole 24 is screwed with the male screw formed on the adjustment jig 2 and the specimen mount 20 is moved along an axis of the adjustment jig 2. Accordingly, an amount of protrusion of the specimen S from the holder main body 10 can be adjusted. Adjusting an amount of protrusion of the specimen S enables an amount of polishing of the specimen S to be adjusted.

Figure 13:
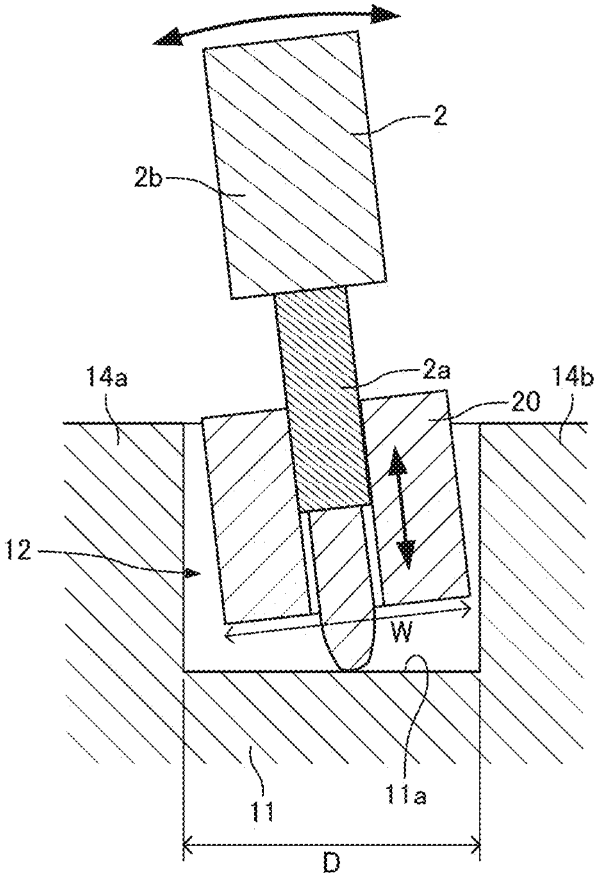
FIG. 13 is a diagram for explaining specimen preparation steps.

FIG. 13 is a sectional view taken along line XIII-XIII in FIG. 9. As illustrated in FIG. 13, a distance D between the first guide rail 14*a* and the second guide rail 14*b* is greater than a width W of the specimen mount 20 between the first groove 26*a* and the second groove 26*b*. In other words, a gap is created between the specimen mount 20 and the first guide rail 14*a* and between the specimen mount 20 and the second guide rail 14*b*. Therefore, the specimen mount 20 can be tilted with respect to the holder main body 10. A size of the gap is, for example, around 1 mm. For example, the specimen mount 20 can be tilted within a range from −5° to +5°.

A tip of the adjustment jig 2 abuts against a bottom surface 11*a* (bottom 11) of the holder main body 10. When tilting the specimen mount 20, the adjustment jig 2 is tilted with the tip of the adjustment jig 2 as a fulcrum. At this point, the tip of the adjustment jig 2 and the bottom surface 11*a* rub against each other. Therefore, the tip of the adjustment jig 2 is preferably a curved surface. In addition, the bottom surface 11*a* is preferably made of a material with a low coefficient of friction. For example, the entire bottom 11 may be made of a material with a low coefficient of friction or only a portion of the bottom 11 that comes into contact with the adjustment jig 2 and a vicinity thereof may be made of a material with a low coefficient of friction. Furthermore, for example, stainless steel may be selected as a material of the bottom 11 and a tip section of the adjustment jig 2 may be made of brass. In addition, for example, only a portion of the bottom 11 which is abutted by the tip of the adjustment jig 2 may be made of stainless steel and other portions of the bottom 11 may be made of a metal such as copper or aluminum. Accordingly, heat dissipation of the holder main body 10 can be improved while reducing the coefficient of friction of a portion of the bottom 11 that comes into contact with the adjustment jig 2.

Since the female screw formed in the through-hole 24 is screwed with the male screw formed on the adjustment jig 2 by rotating the adjustment jig 2, the specimen mount 20 is moved along a central axis of the adjustment jig 2. Accordingly, an amount of protrusion of the specimen S with respect to the holder main body 10 can be adjusted.

As described above, the specimen mount 20 is pressed by the first plunger 30 and the second plunger 40 against the holder main body 10 with a force that enables the specimen mount 20 to be slidable. As a result, when adjusting a tilt of the specimen mount 20 and an amount of protrusion of the specimen mount 20, the inner surface 27*a* and the side surface 15*a* are in constant contact with each other and are in a slidable state and the inner surface 27*b* and the side surface 15*b* are in constant contact with each other and are in a slidable state. Therefore, the specimen mount 20 can be reliably positioned.

After adjusting the position of the specimen mount 20, the specimen mount 20 is fixed to the holder main body 10. The specimen mount 20 is fixed to the holder main body 10 by tightening the first plunger 30 and the second plunger 40. By tightening the first plunger 30, the first spring 34 is compressed and a force by which the first plunger 30 presses the specimen mount 20 increases. In a similar manner, by tightening the second plunger 40, the second spring 44 is compressed and a force by which the second plunger 40 presses the specimen mount 20 increases. Accordingly, the specimen mount 20 can be fixed to the holder main body 10.

After the specimen mount 20 is fixed to the holder main body 10, the adjustment jig 2 is rotated counterclockwise and the adjustment jig 2 is detached from the specimen mount 20.

(5) Polish Specimen with Mechanical Polishing Apparatus (S50)

Figure 14:
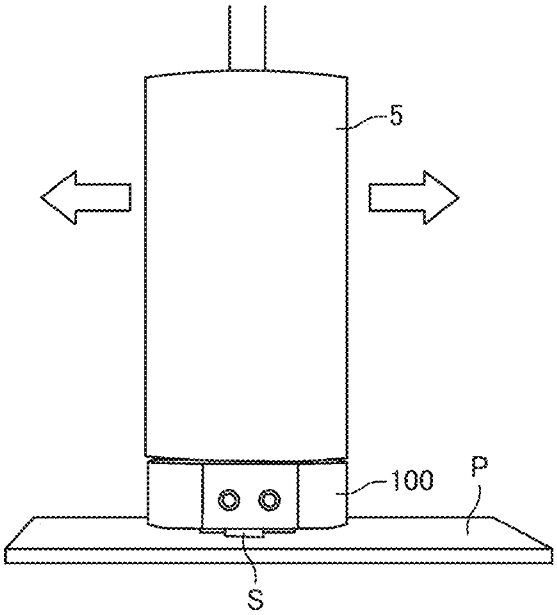
FIG. 14 is a diagram for explaining specimen preparation steps.

As illustrated in FIG. 14, the specimen holder 100 is attached to the mechanical polishing apparatus and the specimen S is polished. Specifically, first, the specimen holder 100 is attached to a holder 5 of the mechanical polishing apparatus. In the mechanical polishing apparatus, the specimen S is polished by reciprocating the specimen S on a polishing sheet P while applying pressure to the holder 5. The applied polishing pressure is, for example, 200 g. A grain size of the polishing sheet P is, for example, around 30 μm. Note that polishing conditions are changed as appropriate depending on a material of the specimen S or the like. For example, HandyLap (manufactured by JEOL Ltd.) can be used as the mechanical polishing apparatus. Mechanical polishing refers to physical polishing using the polishing sheet P or the like.

While a case where the specimen S is polished using a mechanical polishing apparatus has been described above, although not illustrated, the specimen holder 100 may be attached to a holder for manual polishing and the specimen S may be polished by manually reciprocating the specimen S on the polishing sheet P.

After the polishing is over, the specimen holder 100 is detached from the holder 5. In addition, the specimen holder 100 is cleaned with running water and then dried by blowing away moisture using an air blower or the like. Furthermore, the polishing target jig 3 is detached from the mounting part 16.

(6) Attach Shield Plate to Holder Main Body (S60)

Figure 15:
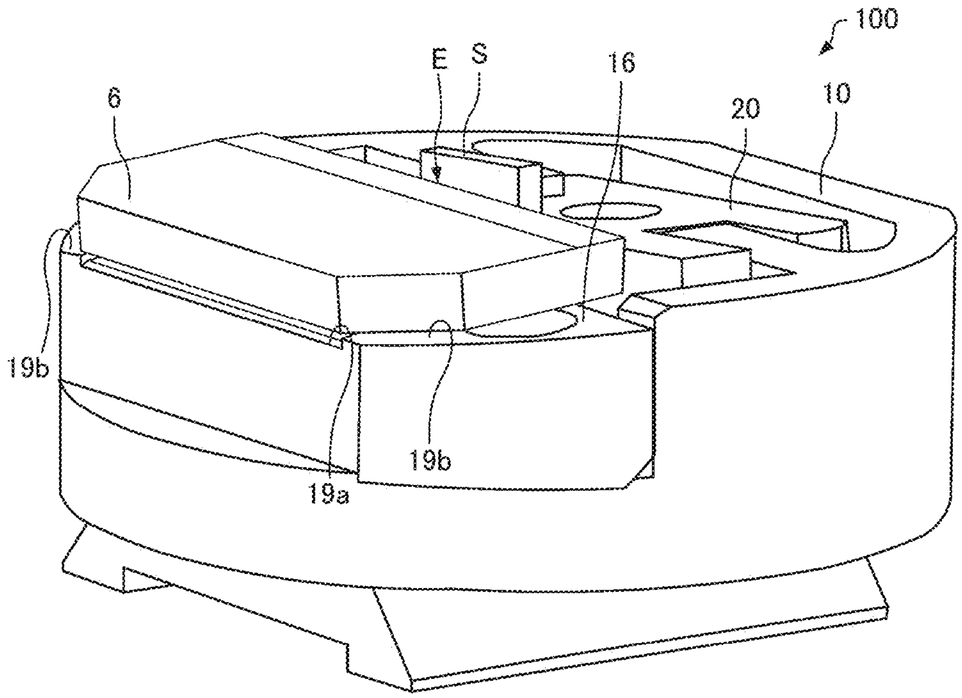
FIG. 15 is a diagram for explaining specimen preparation steps.

As illustrated in FIG. 15, the shield plate 6 is mounted to the mounting part 16 of the holder main body 10. The shield plate 6 is a member for shielding a part of the specimen S in the ion beam milling apparatus. The shield plate 6 is arranged so as to straddle the two second placement surfaces 19*b*. Therefore, the shield plate 6 has a high degree of freedom of arrangement. The shield plate 6 is arranged so as to come into contact with the front surface of the specimen S. Therefore, a position of the shield plate 6 is adjusted in accordance with a thickness of the specimen S.

After the shield plate 6 is mounted to the mounting part 16, the adjustment jig 2 is inserted into the through-hole 24 of the specimen mount 20 that is fixed to the holder main body 10.

(7) Adjust Position of Specimen Mount (S70)

The first plunger 30 and the second plunger 40 are loosened to make the specimen mount 20 slidable with respect to the holder main body 10 and the position of the specimen mount 20 is adjusted. Step S70 is performed in a similar manner to step S40 described above in which the position of the specimen mount 20 is adjusted. In other words, a tilt of the specimen mount 20 is adjusted by tilting the adjustment jig 2. Accordingly, a milling position (a position of a cross section) of the specimen S can be aligned with an edge E of the shield plate 6. In addition, by inserting the adjustment jig 2 into the through-hole 24 and rotating the adjustment jig 2, the female screw formed on the inner surface of the through-hole 24 is screwed with the male screw formed on the adjustment jig 2 and the specimen mount 20 is moved along the axis of the adjustment jig 2. Accordingly, an amount of protrusion of the specimen S from the shield plate 6 can be adjusted.

Figure 16:
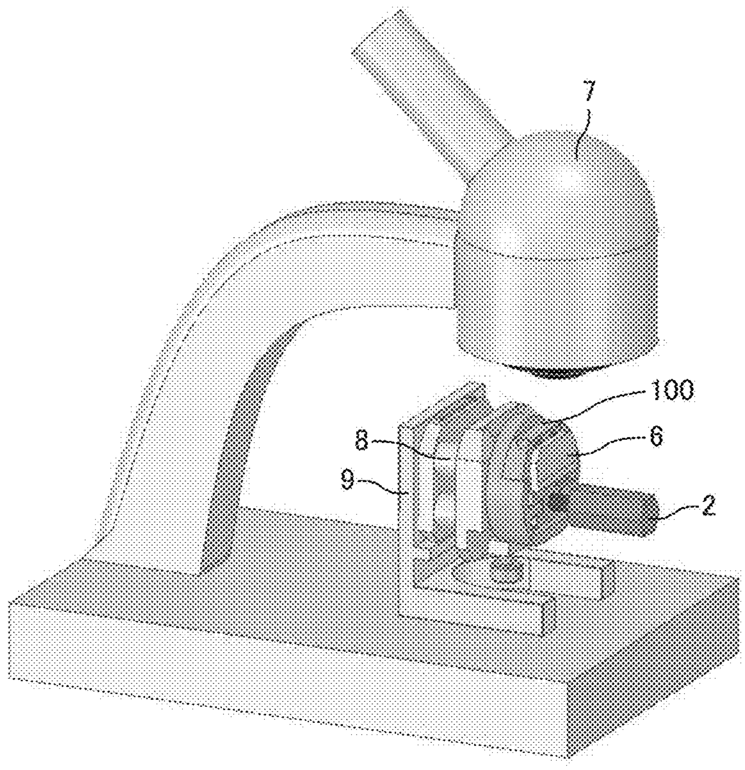
FIG. 16 is a diagram for explaining specimen preparation steps.

In this case, as illustrated in FIG. 16, the position of the specimen mount 20 is adjusted while observing the specimen S and the shield plate 6 with a microscope 7. For example, the microscope 7 is an optical microscope or a stereo microscope. In the microscope 7, a long-focus lens is used and an adjustment operation is performed by increasing a distance between an objective lens of the microscope 7 and the specimen holder 100. For example, an observation magnification is set within a range from several ten to several hundred power.

Figure 17:
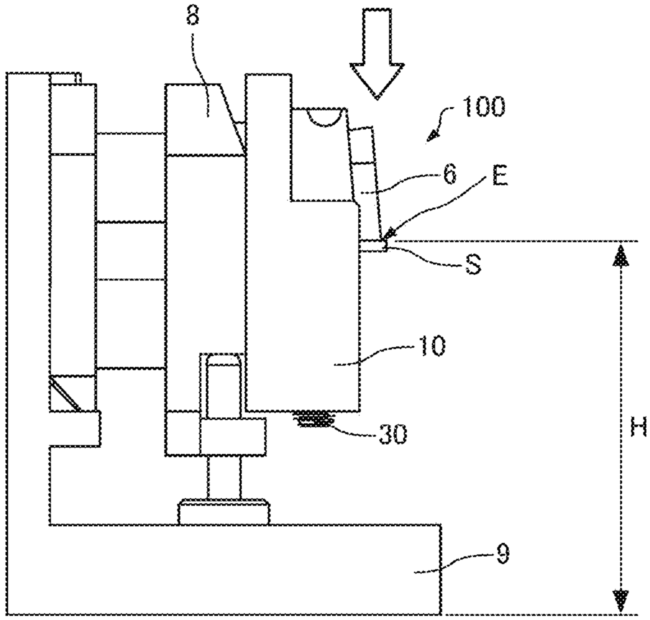
FIG. 17 is a diagram for explaining specimen preparation steps.
Figure 18:
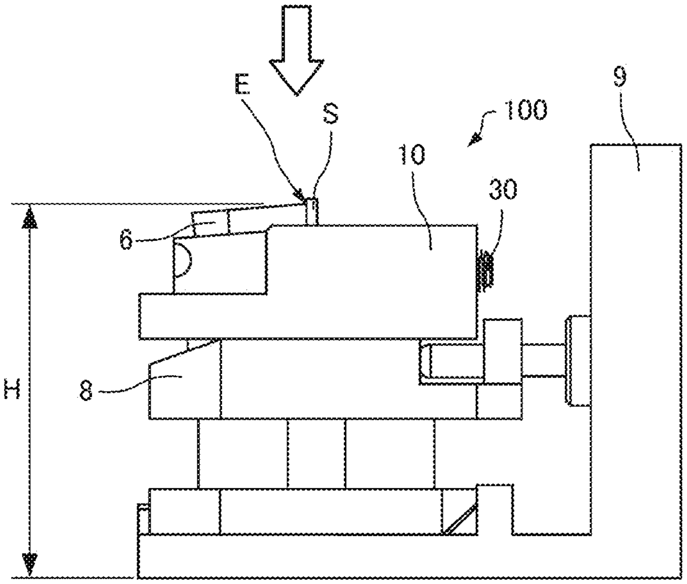
FIG. 18 is a diagram for explaining specimen preparation steps.

As illustrated in FIGS. 17 and 18, the specimen holder 100 is attached to a holder stand 9 via the adapter 8 for attaching the specimen holder 100 to the specimen stage of the ion beam milling apparatus. The holder stand 9 enables the specimen holder 100 to be stably observed under the microscope 7. In this case, as illustrated in FIG. 17, the specimen S is observed over the shield plate 6 and a milling position of the specimen S is aligned with a position of an edge E of the shield plate 6. In addition, from a state illustrated in FIG. 17 where the specimen S is being observed over the shield plate 6, the holder stand 9 is folded back by 90° to create a state illustrated in FIG. 18 where a distance between the shield plate 6 and the specimen S can be confirmed and the distance between the shield plate 6 and the specimen S is adjusted. A height H of the specimen S remains the same even if the holder stand 9 is folded back by 90°. Therefore, even if the holder stand 9 is folded back from a state illustrated in FIG. 17 where the specimen S is being observed over the shield plate 6 to create a state illustrated in FIG. 18 where a distance between the shield plate 6 and the specimen S can be confirmed, defocusing of the microscope 7 can be reduced.

Since an adjustment of the position of the specimen mount 20 can be performed using the adjustment jig 2 as described above, a user can readily adjust the position of the specimen mount 20 even under the microscope 7.

After adjusting the position of the specimen mount 20, the first plunger 30 and the second plunger 40 are tightened to fix the specimen mount 20 to the holder main body 10. After the specimen mount 20 is fixed to the holder main body 10, the adjustment jig 2 is rotated counterclockwise and the adjustment jig 2 is detached from the specimen mount 20. In addition, the adapter 8 to which the specimen holder 100 is attached is detached from the holder stand 9.

Note that step S40 described above of adjusting the position of the specimen mount 20 may be performed under the microscope in a similar manner to step S70. In addition, step S70 need not be performed under the microscope.

(8) Mill Specimen with Ion Beam Milling Apparatus (S80)

Figure 19:
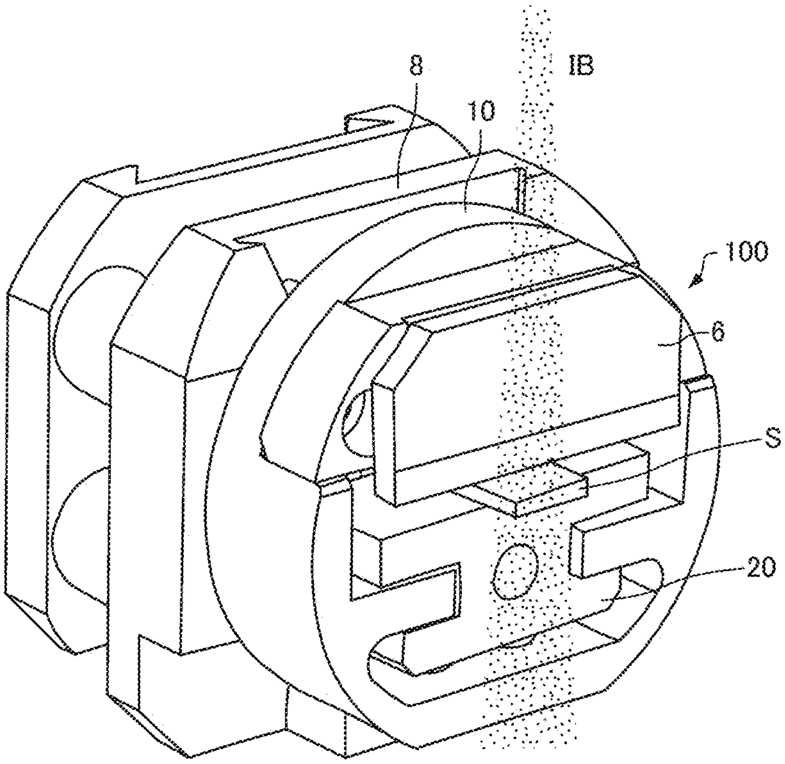
FIG. 19 is a diagram for explaining specimen preparation steps.

As illustrated in FIG. 19, the specimen S held by the specimen holder 100 is milled by the ion beam milling apparatus. First, the adapter 8 to which the specimen holder 100 is attached is attached to the specimen stage of the ion beam milling apparatus. Next, an ion beam IB is radiated in a state where a part of the specimen S is covered by the shield plate 6 to mill a cross section of the specimen S.

A cross-sectional specimen for a scanning electron microscope can be prepared by the steps described above.

1.3. Specimen Holder Set

A specimen holder set includes the specimen holder 100, the adjustment jig 2, the polishing target jig 3, the shield plate 6, the adapter 8, and the holder stand 9. Using such a specimen holder set enables a cross-sectional specimen for a scanning electron microscope to be readily prepared.

1.4. Effects

The specimen holder 100 includes the holder main body 10, the specimen mount 20 to which the specimen S is fixed, and the first plunger 30 and the second plunger 40 as pressing members that slidably press the specimen mount 20 against the holder main body 10. In addition, the specimen mount 20 is provided with the through-hole 24 and the specimen mount 20 tilts with respect to the holder main body 10 by tilting the adjustment jig 2 that is inserted into the through-hole 24. As a result, in the specimen holder 100, the tilt of the specimen mount 20 can be adjusted. Therefore, the specimen holder 100 enables the tilt of the specimen S to be adjusted. In addition, since the specimen holder 100 enables the tilt of the specimen mount 20 to be adjusted by tilting the adjustment jig 2 that is inserted into the through-hole 24, a mechanism for adjusting the tilt of the specimen mount 20 can be realized with a simple configuration.

In the specimen holder 100, the specimen mount 20 includes the first surface 23*a*, the second surface 23*b* which faces an opposite direction to the first surface 23*a*, and the third surface 23*c* which is orthogonal to the first surface 23*a* and the second surface 23*b*. In addition, the through-hole 24 penetrates the specimen mount 20 between the first surface 23*a* and the second surface 23*b* and the first plunger 30 and the second plunger 40 press the third surface 23*c* of the specimen mount 20. Therefore, in the specimen holder 100, the specimen mount 20 can be tilted with respect to the holder main body 10 while pressing the specimen mount 20 against the holder main body 10.

In the specimen holder 100, forces by which the first plunger 30 and the second plunger 40 press the specimen mount 20 against the holder main body 10 are variable. Therefore, when adjusting the position of the specimen mount 20, the specimen mount 20 can be made slidable with respect to the holder main body 10 and, when polishing the specimen S with the mechanical polishing apparatus or milling the specimen S with the ion beam milling apparatus, the specimen mount 20 can be fixed to the holder main body 10.

In the specimen holder 100, the pressing member which presses the specimen mount 20 includes the first plunger 30 and the second plunger 40. Using two plungers in this manner can prevent the specimen mount 20 from being displaced when fixing the specimen mount 20 to the holder main body 10. For example, when there is one plunger, the specimen mount 20 rotates due to the rotation of the plunger when tightening the plunger. By contrast, when there are two plungers, when tightening one of the plungers, the rotation of the specimen mount 20 due to the rotation of the one plunger can be suppressed by the other plunger. Therefore, the specimen mount 20 can be prevented from being displaced when fixing the specimen mount 20 to the holder main body 10.

In the specimen holder 100, the first plunger 30 includes the first contact member 32 which comes into contact with the specimen mount 20, the first spring 34 which imparts a pressing force to the first contact member 32, and the first shaft 36 which has a male screw formed on an outer circumferential surface thereof and which houses the first spring 34 therein. In addition, the second plunger 40 includes the second contact member 42 which comes into contact with the specimen mount 20, the second spring 44 which imparts a pressing force to the second contact member 42, and the second shaft 46 which has a male screw formed on an outer circumferential surface thereof and which houses the second spring 44 therein. Furthermore, the male screw formed on the first shaft 36 screws with a female screw formed on an inner surface of the first hole 17*a* provided in the holder main body 10, and the male screw formed on the second shaft 46 screws with a female screw formed on an inner surface of the second hole 17*b* provided in the holder main body 10. In addition, a force by which the first plunger 30 presses the specimen mount 20 against the holder main body 10 changes by rotating the first plunger 30, and a force by which the second plunger 40 presses the specimen mount 20 against the holder main body 10 changes by rotating the second plunger 40. Therefore, in the specimen holder 100, the forces by which the first plunger 30 and the second plunger 40 press the specimen mount 20 can be made variable.

In the specimen holder 100, a female screw is formed on an inner surface of the through-hole 24 of the specimen mount 20, a male screw is formed on the adjustment jig 2, and the specimen mount 20 moves along the axis of the adjustment jig 2 by rotating the adjustment jig 2 that is inserted into the through-hole 24. As a result, in the specimen holder 100, the position of the specimen mount 20 along the axis of the adjustment jig 2 can be adjusted. Therefore, for example, the specimen holder 100 enables an amount of protrusion of the specimen S from the shield plate 6 to be adjusted.

In the specimen holder 100, the holder main body 10 includes the mounting part 16 to which the shield plate 6 of the ion beam milling apparatus and the polishing target jig 3 for the mechanical polishing apparatus are to be interchangeably mounted. Therefore, the specimen holder 100 can be used as a specimen holder to be shared by the mechanical polishing apparatus and the ion beam milling apparatus.

In the specimen holder 100, the holder main body 10 is provided with the guide 14 which restricts a movement range of the specimen mount 20. As a result, in the specimen holder 100, the tilt of the specimen mount 20 can be readily adjusted using the adjustment jig 2.

A specimen holder set includes the specimen holder 100 and the adjustment jig 2. Therefore, with the specimen holder set, the tilt of the specimen mount 20 and an amount of protrusion of the specimen mount 20 can be adjusted using the adjustment jig 2.

The specimen preparation method according to the first embodiment includes a step of fixing the specimen S to the specimen mount 20, a step of pressing the specimen mount 20 to which the specimen S is fixed against the holder main body 10 using the first plunger 30 and the second plunger 40 so as to be slidable, and a step of inserting the adjustment jig 2 into the through-hole 24 provided in the specimen mount 20 and adjusting a tilt of the specimen mount 20 by tilting the adjustment jig 2. Therefore, with the specimen preparation method according to the first embodiment, the tilt of the specimen mount 20 attached to the holder main body 10 can be adjusted.

The specimen preparation method according to the first embodiment includes a step of milling the specimen S fixed to the specimen mount 20 with a mechanical polishing apparatus and a step of milling the specimen S fixed to the specimen mount 20 with an ion beam milling apparatus. In this manner, in the specimen preparation method according to the first embodiment, the specimen holder 100 can be shared between the mechanical polishing apparatus and the ion beam milling apparatus.

The specimen preparation method according to the first embodiment includes a step of mounting the shield plate 6 which shields a part of the specimen S to the holder main body 10 before the step of milling with the ion beam milling apparatus. Therefore, in the specimen preparation method according to the first embodiment, the specimen S can be irradiated with an ion beam in a state where a part of the specimen S is covered by the shield plate 6.

The specimen preparation method according to the first embodiment includes a step of mounting the polishing target jig 3 which holds a target of an amount of polishing of the specimen S to the holder main body 10 before the step of milling with the mechanical polishing apparatus. Therefore, in the specimen preparation method according to the first embodiment, the amount of polishing of the specimen S can be comprehended during mechanical polishing.

In the specimen preparation method according to the first embodiment, in the step of adjusting a tilt of the specimen mount 20, the first plunger 30 and the second plunger 40 press the specimen mount 20 with a first pressing force. In addition, in the step of polishing the specimen S with the mechanical polishing apparatus, the first plunger 30 and the second plunger 40 press the specimen mount 20 with a second pressing force. Furthermore, the first pressing force is smaller than the second pressing force. Therefore, in the specimen preparation method according to the first embodiment, the specimen mount 20 is made slidable with respect to the holder main body 10 by having the first plunger 30 and the second plunger 40 press the specimen mount 20 with the first pressing force, and the specimen mount 20 can be fixed to the holder main body 10 by having the first plunger 30 and the second plunger 40 press the specimen mount 20 with the second pressing force.

The specimen preparation method according to the first embodiment includes a step of inserting the adjustment jig 2 into the through-hole 24, rotating the adjustment jig 2 to cause the female screw formed on the inner surface of the through-hole 24 to screw with the male screw formed on the adjustment jig 2, and moving the specimen mount 20 along the axis of the adjustment jig 2. Therefore, with the specimen preparation method according to the first embodiment, the amount of protrusion of the specimen mount 20 with respect to the holder main body 10 can be adjusted.

1.5. Modifications 1.5.1. First Modification

While a case in which a specimen for a scanning electron microscope is prepared using both a mechanical polishing apparatus and an ion beam milling apparatus has been explained in the first embodiment described above, the specimen may be lapped before polishing using the mechanical polishing apparatus. In lapping, the specimen S is more roughly polished than the polishing in step S50 in which the specimen is polished with the mechanical polishing apparatus illustrated in FIG. 5. For example, a step of lapping the specimen S is performed after step S10 of fixing the specimen S to the specimen mount 20 and before step S20 of attaching the specimen mount 20 to the holder main body 10. In other words, lapping is performed without attaching the specimen mount 20 to the holder main body 10. Accordingly, contamination adhered to the holder main body 10 due to lapping can be prevented from being carried into the mechanical polishing apparatus and the ion beam milling apparatus.

1.5.2. Second Modification

While a case in which a specimen for a scanning electron microscope is prepared using both a mechanical polishing apparatus and an ion beam milling apparatus has been explained in the first embodiment described above, the specimen may be prepared without using the mechanical polishing apparatus and using only the ion beam milling apparatus. In this case, the specimen S can be fixed to the specimen mount 20 using a clip, a leaf spring, or the like. Accordingly, the specimen S can be easily fixed to the specimen mount 20. In this manner, means for fixing the specimen S to the specimen mount 20 can be changed as appropriate in accordance with a shape of the specimen S or an apparatus used for specimen preparation.

2. Second Embodiment 2.1. Specimen Holder

Figure 20:
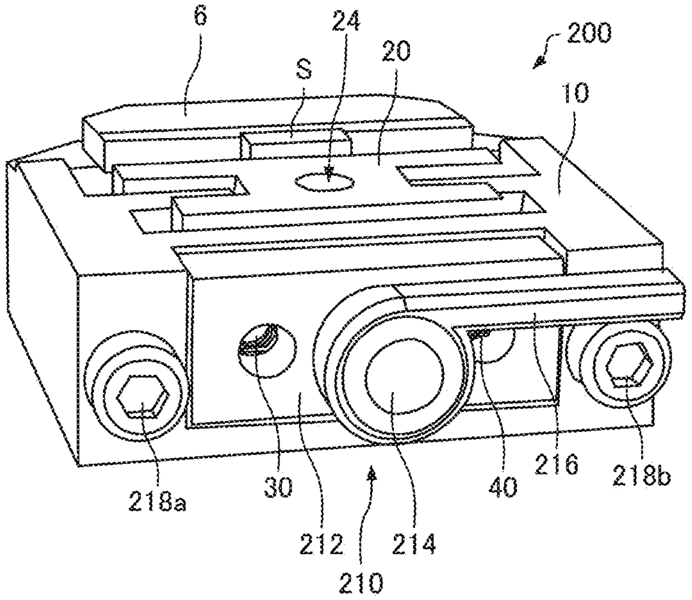
FIG. 20 is a diagram illustrating a configuration of a specimen holder according to the second embodiment.
Figure 21:
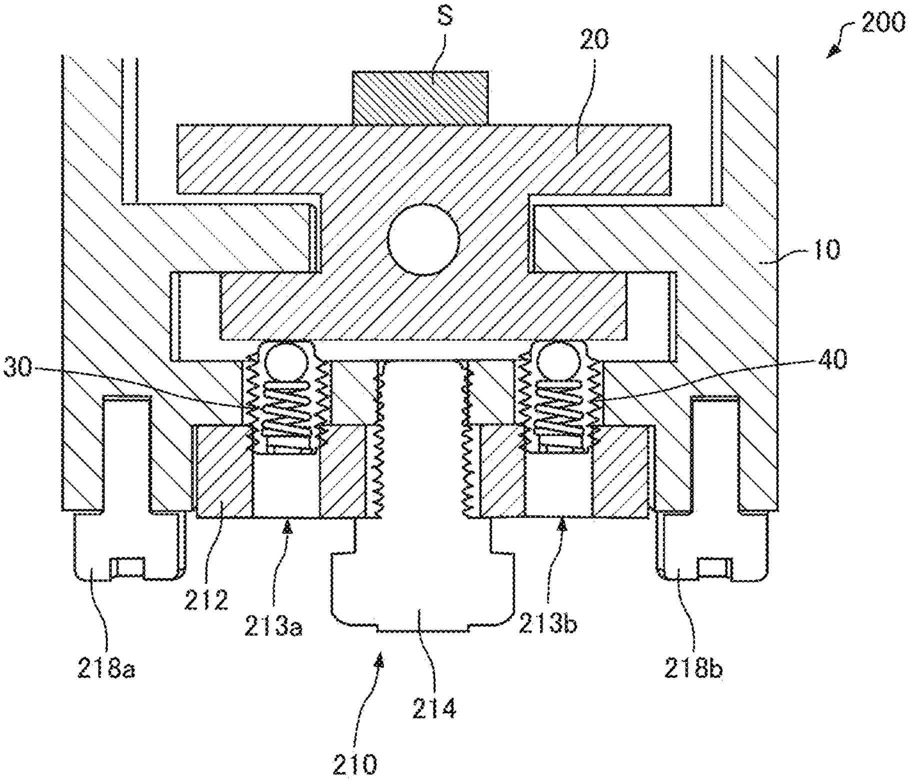
FIG. 21 is a diagram illustrating a configuration of a specimen holder according to the second embodiment.
Figure 22:
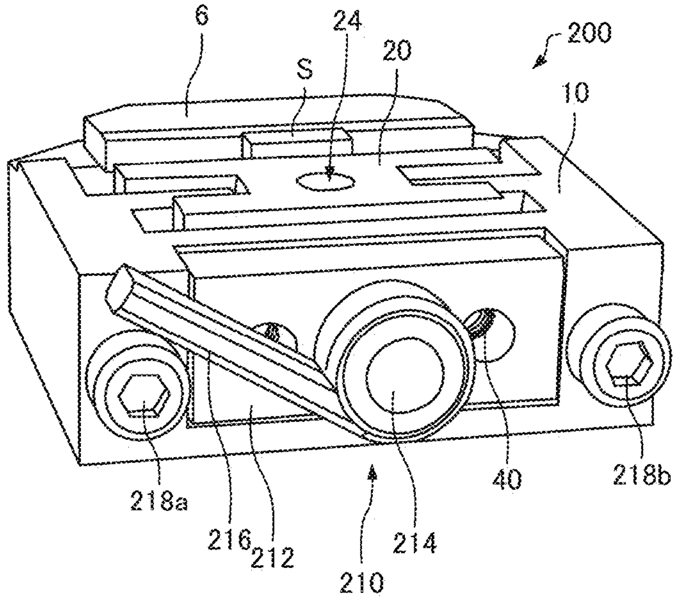
FIG. 22 is a diagram illustrating a configuration of a specimen holder according to the second embodiment.
Figure 23:
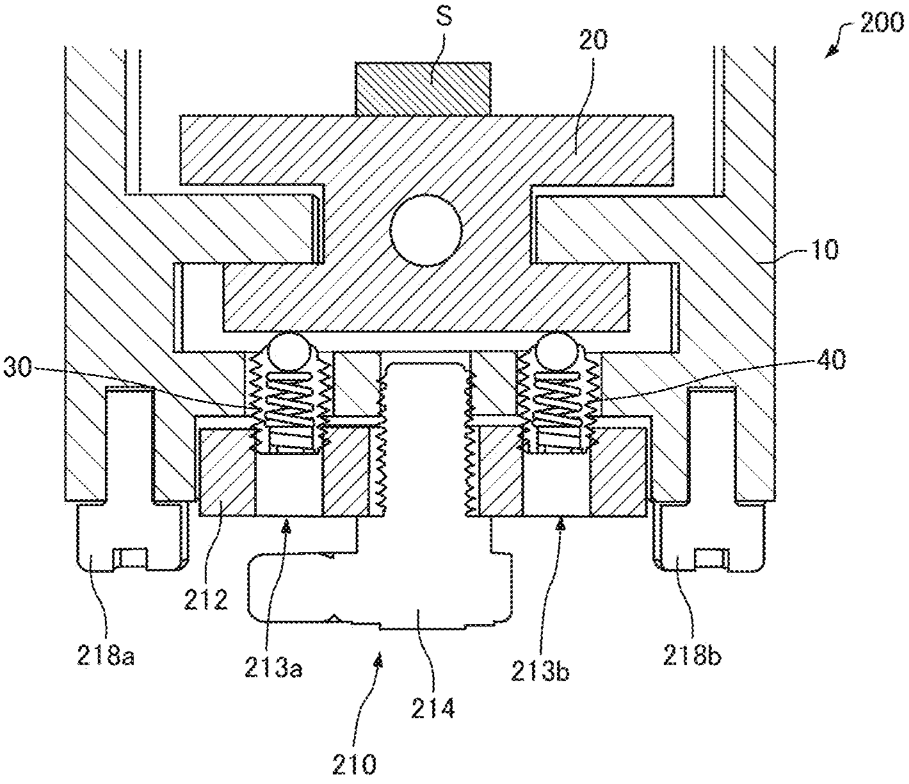
FIG. 23 is a diagram illustrating a configuration of a specimen holder according to the second embodiment.

Next, a specimen holder according to a second embodiment will be described with reference to the drawings. FIGS. 20 to 23 are diagrams illustrating a configuration of a specimen holder 200 according to the second embodiment. Note that FIGS. 20 and 21 illustrate a state where the specimen mount 20 is fixed to the holder main body 10 by the first plunger 30 and the second plunger 40. FIGS. 22 and 23 illustrate a state where the specimen mount 20 is pressed against the holder main body 10 by the first plunger 30 and the second plunger 40 with a force that enables the specimen mount 20 to be slidable. Hereinafter, in the specimen holder 200 according to the second embodiment, members having similar functions to the components of the specimen holder 100 according to the first embodiment will be denoted by same reference signs and a detailed description thereof will be omitted.

As illustrated in FIGS. 20 to 23, the specimen holder 200 includes a moving mechanism 210 which simultaneously moves the first plunger 30 and the second plunger 40. By having the moving mechanism 210 simultaneously move the first plunger 30 and the second plunger 40, forces by which the first plunger 30 and the second plunger 40 press the specimen mount 20 can be simultaneously changed.

The moving mechanism 210 includes a base 212, a screw 214, a lever 216, a first stopper 218*a*, and a second stopper 218*b*. The first plunger 30 and the second plunger 40 are fixed to the base 212. A through-hole 213*a* and a through-hole 213*b* are formed in the base 212. A female screw with which the male screw formed on the first shaft 36 of the first plunger 30 screws is formed in the through-hole 213*a*. A female screw with which the male screw formed on the second shaft 46 of the second plunger 40 screws is formed in the through-hole 213*b*. The first plunger 30 is inserted into the through-hole 213*a* and the second plunger 40 is inserted into the through-hole 213*b*.

The screw 214 fixes the base 212 to the holder main body 10. The screw 214 screws with a screw hole formed in the holder main body 10. By loosening the screw 214, as illustrated in FIG. 23, a distance between the base 212 and the specimen mount 20 increases and forces by which the first plunger 30 and the second plunger 40 press the specimen mount 20 decrease. In addition, by tightening the screw 214, as illustrated in FIG. 21, the distance between the base 212 and the specimen mount 20 decreases and forces by which the first plunger 30 and the second plunger 40 press the specimen mount 20 increase.

The lever 216 causes the screw 214 to rotate. By rotating the screw 214 with the lever 216, the screw 214 can be loosened or the screw 214 can be tightened.

The first stopper 218*a* and the second stopper 218*b* restrict a movable range of the lever 216. For example, the movement range of the lever 216 can be restricted by the first stopper 218*a* and the second stopper 218*b* to a range in which forces by which the first plunger 30 and the second plunger 40 press the specimen mount 20 are created.

2.2. Specimen Preparation Method

Next, a specimen preparation method using the specimen holder 200 will be described. Hereinafter, points that differ from the example of the specimen preparation method using the specimen holder 100 described above will be explained and a description of similar points will be omitted.

In step S40 of adjusting a position of the specimen mount 20, after adjusting the position of the specimen mount 20 in a state where the specimen mount 20 is pressed against the holder main body 10 by the first plunger 30 and the second plunger 40 with a force that enables the specimen mount 20 to be slidable, the specimen mount 20 is fixed to the holder main body 10. At this point, as illustrated in FIG. 22, the lever 216 having been in contact with the first stopper 218*a* is rotated clockwise to cause the lever 216 to abut with the second stopper 218*b* as illustrated in FIG. 20. Accordingly, force by which the first plunger 30 and the second plunger 40 press the specimen mount 20 increase and the specimen mount 20 can be fixed to the holder main body 10.

In step S70 of adjusting the position of the specimen mount 20, before adjusting the position of the specimen mount 20, the specimen mount 20 is made slidable with respect to the holder main body 10. At this point, as illustrated in FIG. 20, the lever 216 having been in contact with the second stopper 218*b* is rotated counterclockwise to cause the lever 216 to abut with the first stopper 218*a* as illustrated in FIG. 22. Accordingly, forces by which the first plunger 30 and the second plunger 40 press the specimen mount 20 decrease and the specimen mount 20 can be made slidable with respect to the holder main body 10.

In addition, after adjusting the position of the specimen mount 20, the specimen mount 20 is fixed to the holder main body 10. At this point, as illustrated in FIG. 22, the lever 216 having been in contact with the first stopper 218*a* is rotated clockwise to cause the lever 216 to abut with the second stopper 218*b* as illustrated in FIG. 20. Accordingly, forces by which the first plunger 30 and the second plunger 40 press the specimen mount 20 increase and the specimen mount 20 can be fixed to the holder main body 10.

2.3. Effects

The specimen holder 200 includes the moving mechanism 210 which simultaneously moves the first plunger 30 and the second plunger 40 and which simultaneously changes forces by which the first plunger 30 and the second plunger 40 press the specimen mount 20 against the holder main body 10. Therefore, in the specimen holder 200, modes can be readily switched between a mode in which the specimen mount 20 is made slidable with respect to the holder main body 10 and a mode in which the specimen mount 20 is fixed to the holder main body 10.

3. Third Embodiment

3.1. Specimen Holder

Figure 24:
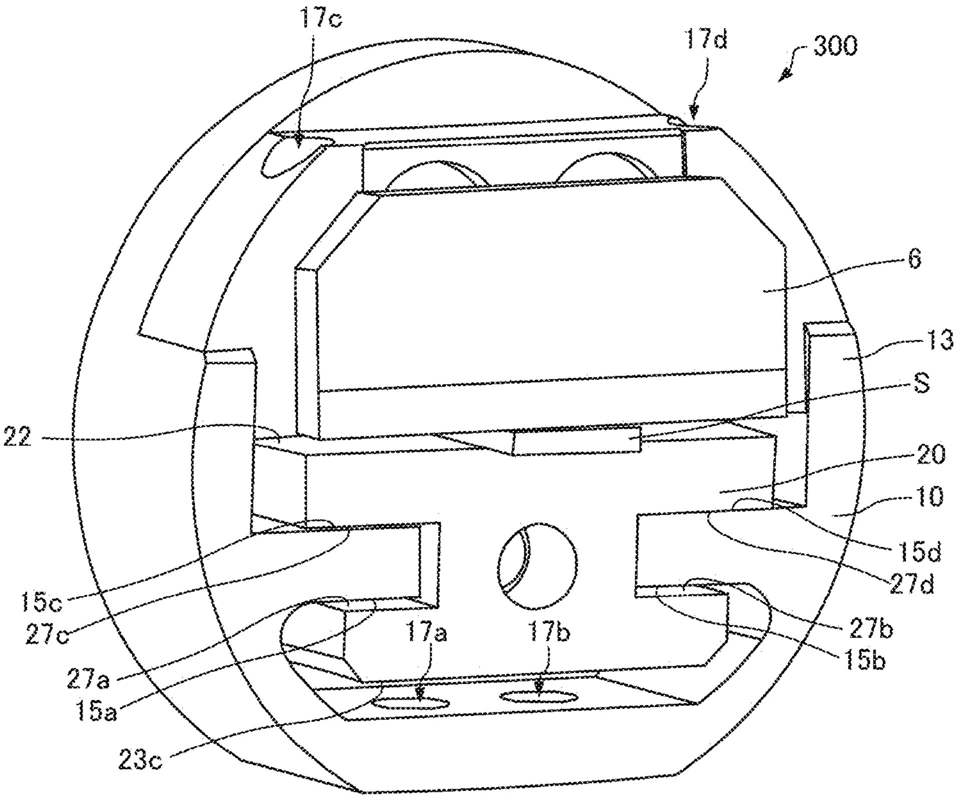
FIG. 24 is a perspective view schematically illustrating a specimen holder according to the third embodiment.
Figure 25:
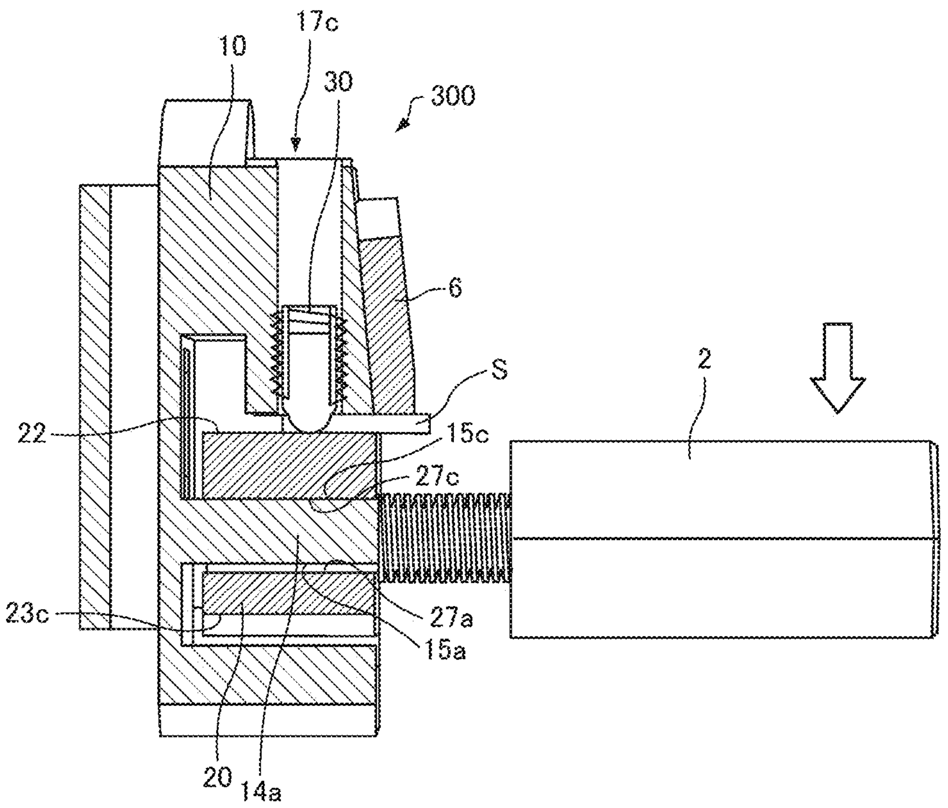
FIG. 25 is a sectional view schematically illustrating a specimen holder according to the third embodiment.

Next, a specimen holder according to a third embodiment will be described with reference to the drawings. FIG. 24 is a perspective view schematically illustrating a specimen holder 300 according to the third embodiment. FIG. 25 is a sectional view schematically illustrating the specimen holder 300 according to the third embodiment. Hereinafter, in the specimen holder 300 according to the third embodiment, members having similar functions to the components of the specimen holder 100 according to the first embodiment will be denoted by same reference signs and a detailed description thereof will be omitted.

In the specimen holder 100 described above, the first plunger 30 and the second plunger 40 press the third surface 23*c* of the specimen mount 20. In contrast, in the specimen holder 300, the first plunger 30 and the second plunger 40 can press the specimen placement surface 22 of the specimen mount 20.

The first hole 17*a* and the second hole 17*b* are formed in the holder main body 10. The holder main body 10 further includes a third hole 17*c* and a fourth hole 17*d*. The first hole 17*a* and the second hole 17*b* are formed so that the first plunger 30 and the second plunger 40 come into contact with the third surface 23*c* of the specimen mount 20. The third hole 17*c* and the fourth hole 17*d* are formed so that the first plunger 30 and the second plunger 40 come into contact with the specimen placement surface 22 of the specimen mount 20.

In the example illustrated in FIG. 25, the first plunger 30 is inserted into the third hole 17*c* and the second plunger 40 is inserted into the fourth hole 17*d*. Therefore, in the specimen holder 300, the first plunger 30 and the second plunger 40 can press the specimen mount 20 from the side of the shield plate 6.

In the specimen holder 300, due to the specimen mount 20 being pressed by the first plunger 30 and the second plunger 40, the inner surface 27*c* of the first groove 26*a* of the specimen mount 20 is pressed against a side surface 15*c* of the first guide rail 14*a* of the holder main body 10 and the inner surface 27*d* of the second groove 26*b* of the specimen mount 20 is pressed against a side surface 15*d* of the second guide rail 14*b* of the holder main body 10. Therefore, the inner surface 27*c* and the side surface 15*c* can be made a sliding surface against which the specimen mount 20 slides and the inner surface 27*d* and the side surface 15*d* can be made a sliding surface against which the specimen mount 20 slides. The inner surface 27*c* is a surface which opposes the inner surface 27*a* and the inner surface 27*d* is a surface which opposes the inner surface 27*b*. In addition, the side surface 15*c* is a surface which faces an opposite direction to the side surface 15*a* and the side surface 15*d* is a surface which faces an opposite direction to the side surface 15*b*.

3.2. Specimen Preparation Method

Next, a specimen preparation method using the specimen holder 300 will be described. Hereinafter, points that differ from the example of the specimen holder 100 described above will be explained and a description of similar points will be omitted.

In step S70 of adjusting a position of the specimen mount 20, as illustrated in FIG. 25, the shield plate 6 is arranged above the specimen mount 20. Accordingly, the adjustment jig 2 can be operated while observing the specimen S over the shield plate 6. At this point, it is difficult for a user to keep the adjustment jig 2 horizontal and the user inadvertently applies a force downward as indicated by an arrow. In the specimen holder 300, the specimen mount 20 is pressed from above by the first plunger 30 and the second plunger 40. Therefore, even when the user applies a downward force to the adjustment jig 2, the specimen mount 20 can be made less susceptible to tilting.

Figure 26:
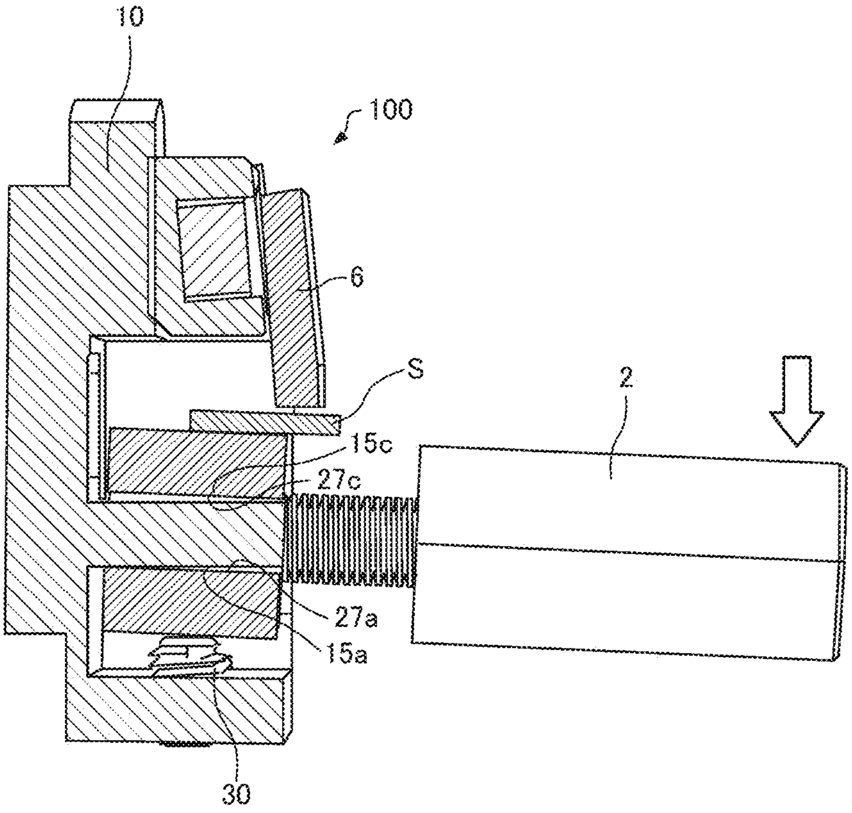
FIG. 26 is a sectional view schematically illustrating a specimen holder according to the third embodiment.

FIG. 26 is a diagram for explaining an operation of the specimen holder 300 when the first plunger 30 is inserted into the first hole 17*a* and the second plunger 40 is inserted into the second hole 17*b*. As illustrated in FIG. 26, when the shield plate 6 is arranged above the specimen mount 20, the specimen mount 20 is pressed from below by the first plunger 30 and the second plunger 40. Therefore, when the user applies a downward force, the first plunger 30 (first spring 34) and the second plunger 40 (second spring 44) are compressed and the specimen mount 20 tilts. For example, when the specimen mount 20 tilts as illustrated in FIG. 26, a distance between the specimen S and the shield plate 6 increases and a milling position appears to deviate.

By contract, as illustrated in FIG. 25, when the first plunger 30 is inserted into the third hole 17*c* and the second plunger 40 is inserted into the fourth hole 17*d*, the specimen mount 20 is pressed from above by the first plunger 30 and the second plunger 40 when the shield plate 6 is arranged above the specimen mount 20. Accordingly, since the inner surface 27*c* and the side surface 15*c* come into surface contact with each other and the inner surface 27*d* and the side surface 15*d* come into surface contact with each other, the specimen mount 20 is less likely to tilt even when a downward force is applied to the adjustment jig 2. Therefore, the specimen mount 20 can be made less susceptible to tilting even when a downward force is applied to the adjustment jig 2.

In the specimen holder 300, since the first hole 17*a*, the second hole 17*b*, the third hole 17*c*, and the fourth hole 17*d* are formed in the holder main body 10, the first plunger 30 can also be inserted into the first hole 17*a* and the second plunger 40 can also be inserted into the second hole 17*b*. Therefore, in the specimen holder 300, a direction in which the specimen mount 20 is pressed by the first plunger 30 and the second plunger 40 can be selected. Note that, although not illustrated, the third hole 17*c* and the fourth hole 17*d* may be formed in the holder main body 10 without forming the first hole 17*a* and the second hole 17*b*.

It should be noted that the embodiments and the modifications described above are merely examples and the invention is not limited thereto. For example, the respective embodiments and the respective modifications may be combined as deemed appropriate.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. A specimen holder comprising:

a holder main body comprising a recessed portion;

a specimen mount to which a specimen is to be fixed, the specimen mount is arranged in the recessed portion of the holder main body, a width of the recessed portion being greater than a width of the specimen mount allowing the specimen mount to be tilted with respect to the holder main body; and a pressing member which slidably presses the specimen mount against the holder main body, wherein the pressing member comprises a first plunger and a second plunger, and wherein the first plunger comprises:

a first contact member which comes into contact with the specimen mount;

a first spring which imparts a pressing force to the first contact member; and a first shaft which has an outer circumferential surface on which a male screw is formed, and in which the first spring is housed, the second plunger comprises:

a second contact member which comes into contact with the specimen mount;

a second spring which imparts a pressing force to the second contact member; and a second shaft which has an outer circumferential surface on which a male screw is formed, and in which the second spring is housed, the male screw formed on the first shaft screws with a female screw formed on an inner surface of a first hole provided in the holder main body, the male screw formed on the second shaft screws with a female screw formed on an inner surface of a second hole provided in the holder main body, a force by which the first plunger presses the specimen mount against the holder main body changes by rotating the first plunger, and a force by which the second plunger presses the specimen mount against the holder main body changes by rotating the second plunger.

2. The specimen holder according to claim 1, wherein the specimen mount comprises a first surface, a second surface which faces an opposite direction to the first surface, and a third surface which is orthogonal to the first surface and the second surface, a through-hole penetrates the specimen mount between the first surface and the second surface, and the pressing member presses the third surface of the specimen mount.

3. The specimen holder according to claim 1, wherein a force by which the pressing member presses the specimen mount against the holder main body is variable.

4. The specimen holder according to claim 1, wherein a female screw is formed on an inner surface of a through-hole provided in the specimen mount, a male screw is formed on a rod-like member that is inserted into the through-hole, and the specimen mount moves along an axis of the rod-like member by rotating the rod-like member inserted into the through-hole.

5. The specimen holder according to claim 1, wherein the holder main body comprises a mounting part to which a shield plate of an ion beam milling apparatus and a polishing target jig for a mechanical polishing apparatus are to be interchangeably mounted.

6. The specimen holder according to claim 1, wherein the holder main body is provided with a guide which restricts a movement range of the specimen mount.

7. A specimen holder set comprising:

the specimen holder according to claim 1, and a rod-like member.

8. A specimen holder comprising:

a holder main body comprising a recessed portion;

a specimen mount to which a specimen is to be fixed, the specimen mount is arranged in the recessed portion of the holder main body, a width of the recessed portion being greater than a width of the specimen mount allowing the specimen mount to be tilted with respect to the holder main body;

a pressing member which slidably presses the specimen mount against the holder main body, the pressing member comprising a first plunger and a second plunger; and a moving mechanism which simultaneously moves the first plunger and the second plunger and which simultaneously changes forces by which the first plunger and the second plunger press the specimen mount against the holder main body.

9. A specimen preparation method comprising:

fixing a specimen to a specimen mount;

slidably pressing the specimen mount to which the specimen has been fixed, against a holder main body by a pressing member, the specimen mount being arranged in the recessed portion of the holder main body, a width of the recessed portion being greater than a width of the specimen mount allowing the specimen mount to be tilted with respect to the holder main body; and inserting a rod-like member into a through-hole provided in the specimen mount and adjusting a tilt of the specimen mount by tilting the rod-like member, wherein in adjusting a tilt of the specimen mount, the pressing member presses the specimen mount with a first pressing force, in polishing the specimen with the mechanical polishing apparatus, the pressing member presses the specimen mount with a second pressing force, and the first pressing force is smaller than the second pressing force.

10. The specimen preparation method according to claim 9, further comprising:

polishing, with a mechanical polishing apparatus, the specimen fixed to the specimen mount; and milling, with an ion beam milling apparatus, the specimen fixed to the specimen mount.

11. The specimen preparation method according to claim 10, further comprising:

mounting a shield plate which shields a part of the specimen to the holder main body before milling with the ion beam milling apparatus.

12. The specimen preparation method according to claim 10, further comprising:

mounting a polishing target jig which holds a target to be a guide of an amount of polishing of the specimen to the holder main body before polishing with the mechanical polishing apparatus.

13. The specimen preparation method according to claim 9, further comprising:

inserting the rod-like member into the through-hole, causing a female screw formed on an inner surface of the through-hole to screw with a male screw formed on the rod-like member by rotating the rod-like member, and moving the specimen mount along an axis of the rod-like member.

* * * * *